(12) United States Patent
Probst

(10) Patent No.: US 6,787,485 B1
(45) Date of Patent: Sep. 7, 2004

(54) APPLIANCE AND METHOD FOR TEMPERING A PLURALITY OF PROCESS ITEMS BY ABSORPTION OF ELECTROMAGNETIC RADIATION GENERATED BY PLURAL SOURCES OF THE RADIATION

(75) Inventor: Volker Probst, Munich (DE)

(73) Assignee: Shell Solar GmbH, Munich (DE)

( * ) Notice: Subject to any disclaimer, the term of this patent is extended or adjusted under 35 U.S.C. 154(b) by 106 days.

(21) Appl. No.: 10/111,283

(22) PCT Filed: Oct. 20, 2000

(86) PCT No.: PCT/DE00/03720

§ 371 (c)(1),
(2), (4) Date: Apr. 22, 2002

(87) PCT Pub. No.: WO01/29902

PCT Pub. Date: Apr. 26, 2001

(30) Foreign Application Priority Data

Oct. 20, 1999 (DE) .......................................... 199 50 498

(51) Int. Cl.[7] .......................... H01L 35/34; H01L 21/26; H01L 21/477
(52) U.S. Cl. ....................................... 438/798; 136/201
(58) Field of Search .................. 438/798, 47; 136/201, 136/244, 249; 257/459

(56) References Cited

U.S. PATENT DOCUMENTS

| | | | |
|---|---|---|---|
| 4,230,589 A | | 10/1980 | Ogawa |
| 4,368,111 A | * | 1/1983 | Siefkin et al. ............... 208/391 |
| 5,090,898 A | | 2/1992 | Smith |
| 5,558,723 A | * | 9/1996 | Ufert .......................... 136/244 |
| 5,578,503 A | | 11/1996 | Karg et al. |
| 5,614,447 A | | 3/1997 | Yamaga et al. |
| 5,861,609 A | | 1/1999 | Kaltenbrunner et al. |
| 5,926,742 A | | 7/1999 | Thakur et al. |
| 6,127,202 A | * | 10/2000 | Kapur et al. .................. 438/47 |
| 6,204,545 B1 | * | 3/2001 | Nakata ........................ 257/459 |

FOREIGN PATENT DOCUMENTS

| | | |
|---|---|---|
| DE | 195 44 525 | 6/1996 |
| EP | 57 183041 | 11/1982 |
| EP | 61 129834 | 6/1986 |
| EP | 0 399 662 | 11/1990 |
| EP | 07 078830 | 3/1995 |
| EP | 0 662 247 | 7/1995 |
| EP | 0 926 719 | 6/1999 |
| JP | 29 32 918 c2 | 2/1980 |
| WO | WO 94/07269 | 3/1994 |

OTHER PUBLICATIONS

F. Karg et al., "Novel Rapid–Thermal–Processing for CIS Thin–Film Solar Cells," IEEE, 1993, pp. 441–446.
J. Ermer et al., "Advances in Large Area CuInSe$_2$ Thin Film Modules," IEEE, 1990, pp. 595–599.
E. Niemi et al., "Small– and Large–Area CIGS Modules by Co–Evaporation," IEEE, 1996, pp. 801–804.
Nowshad Amin et al., "New Approaches on Thinner CdTe Thin–Film Solar Cells," 2nd World Conference and Exhibition on Photovoltaic Solar Energy Conversion, 1998, Vienna, Austria, pp. 1081–1084.

* cited by examiner

Primary Examiner—W. David Coleman
(74) Attorney, Agent, or Firm—Young & Thompson

(57) ABSTRACT

An appliance for the simultaneous tempering and processing of a plurality of process items with the aid of electromagnetic radiation. The appliance is a stack oven, the process items and the energy sources being arranged on one another in such a way that a process item is present between two energy sources and an energy source is present between two process items. The appliance is particularly suitable for tempering the process items in the presence of a process gas. Using the appliance, a variable heating and cooling profile with variable process parameters is possible. In particular, reliable tempering of a process item in the form of a large-area multilayer body with layers of different physical properties is possible.

31 Claims, 10 Drawing Sheets

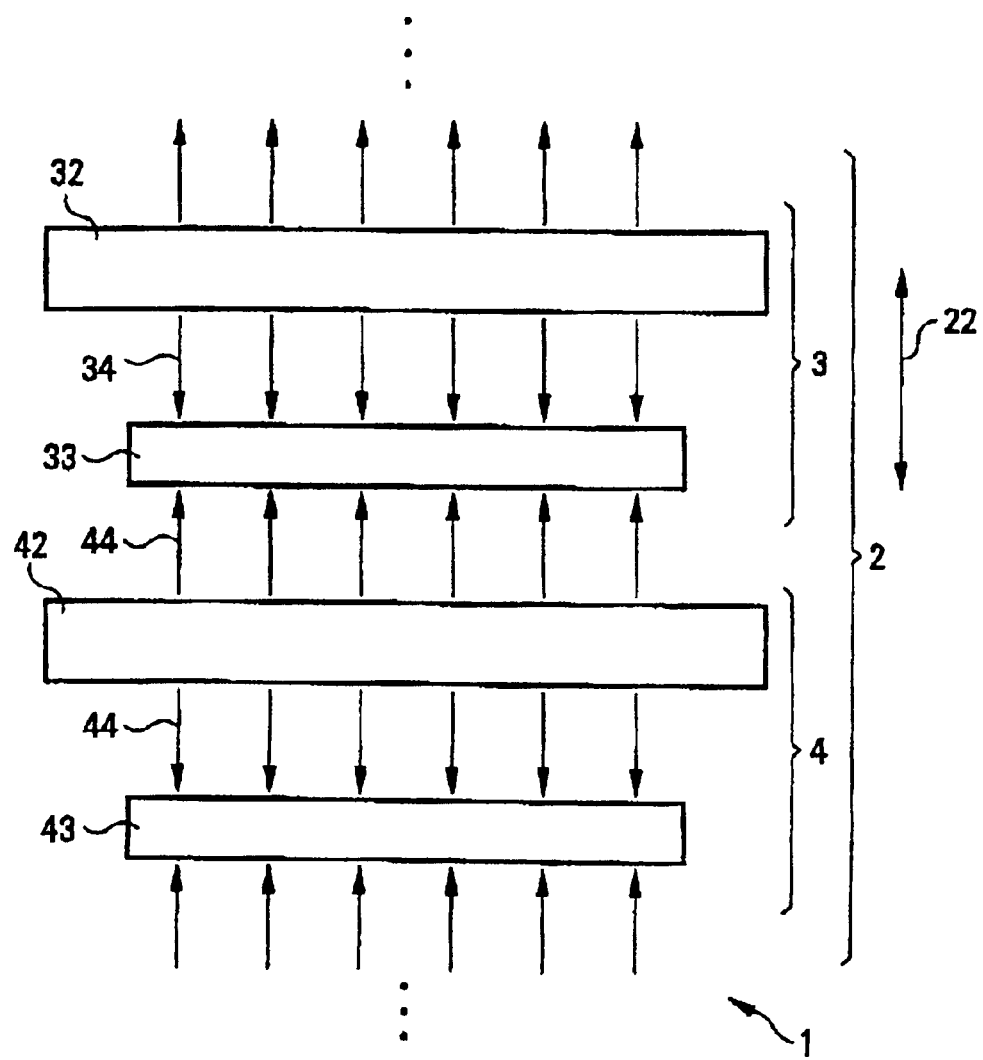

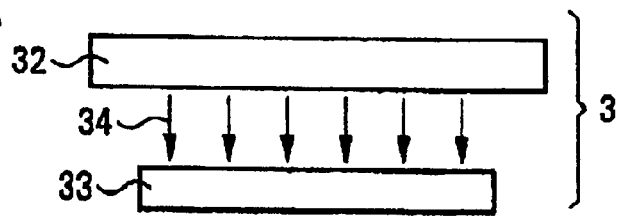
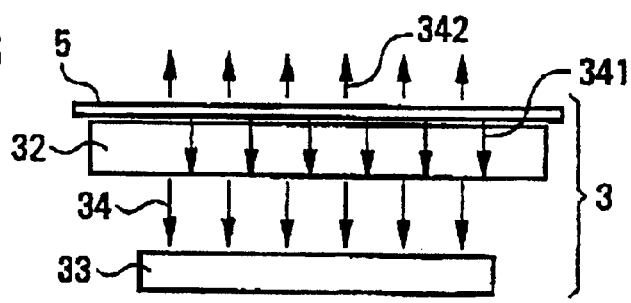
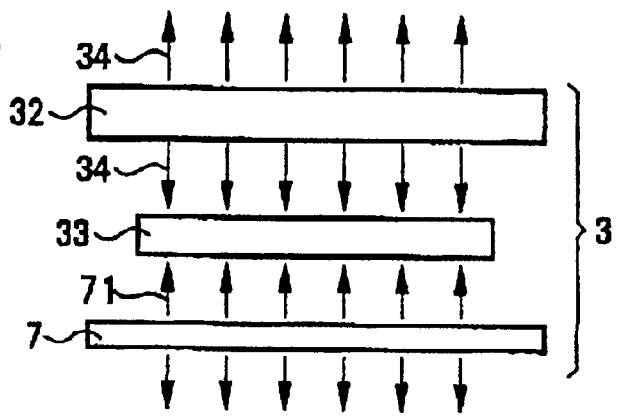
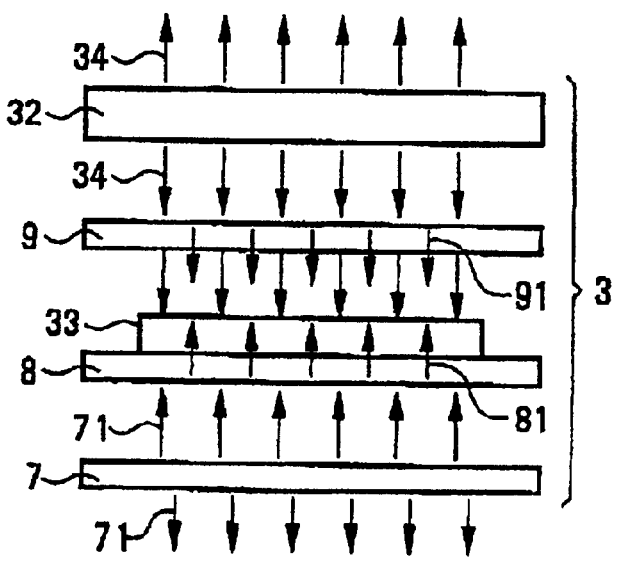

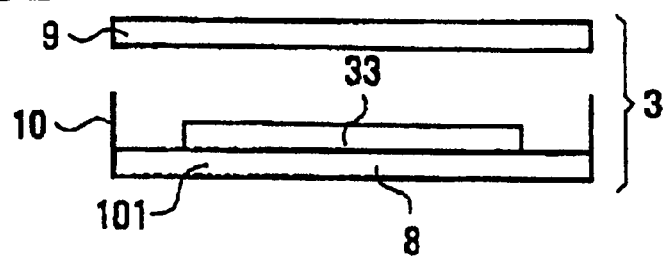
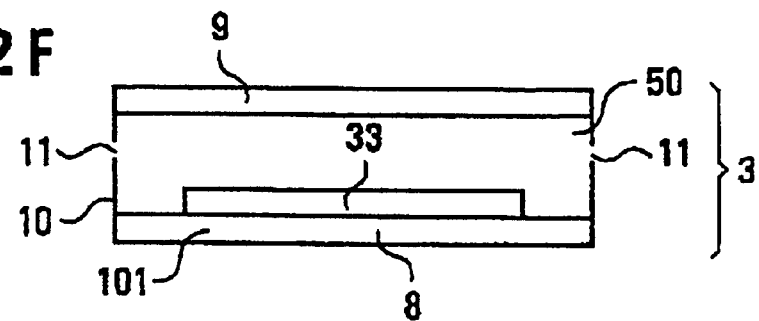
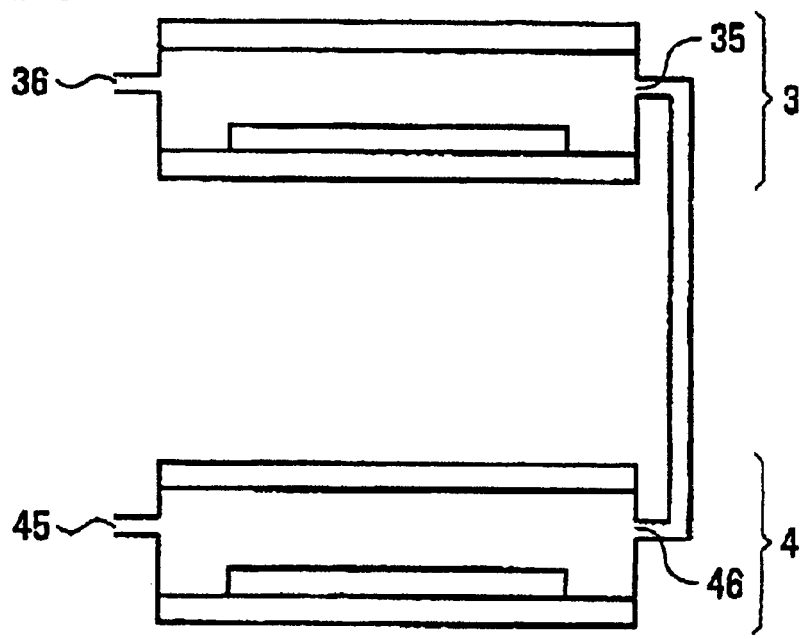

APPLIANCE AND METHOD FOR TEMPERING A PLURALITY OF PROCESS ITEMS BY ABSORPTION OF ELECTROMAGNETIC RADIATION GENERATED BY PLURAL SOURCES OF THE RADIATION

BACKGROUND OF THE INVENTION

The invention relates to an appliance for tempering a process item. Such an appliance is known, for example, from EP 0 662 247 B1. In addition to the appliance, a method for tempering a process item is presented.

The process item known from EP 0 662 247 B1 is a multilayer body which is manufactured by applying a functional layer to a substrate. In order that the functional layer and/or the substrate may exhibit a desired physical (electrical, mechanical, etc) and/or chemical property, a process is carried out on the process item or the layer and/or the substrate. The processing includes tempering the process item in the presence of a gas (process gas).

For tempering, the process item is arranged in a closed graphite tempering container. During the tempering process, the process item is exposed to a process gas with gaseous selenium. During the tempering process, the process item accepts a quantity of energy, a partial quantity of the quantity of energy being supplied to each layer. The tempering process takes place with, for example, a heating rate of 10° C. per second. A halogen lamp is used as the energy source of the quantity of energy. By means of the halogen lamp, the graphite tempering container is radiated by an electromagnetic radiation and the tempering container is heated by this means. Graphite exhibits a high absorption capability for the electromagnetic radiation in the spectral range of the halogen lamp. The quantity of energy absorbed by the graphite is supplied by thermal radiation and/or thermal conduction to the process item. The tempering container therefore functions as a secondary energy source or as an energy transmitter.

Graphite exhibits a high emission capability and a high thermal conductivity. When the process item is laid on the bottom of the tempering container, the supply of the energy quantity to a lower surface of the process item takes place, essentially, by thermal conduction. A quantity of energy is supplied to an upper surface of the process item by thermal radiation, thermal conductivity and convection.

The larger the process item (larger surface), the more different the materials used in the process item (for example strongly differing thermal expansion coefficient, differing absorption capability for the quantity of energy, etc) and the higher the tempering rate is (heating rate, cooling rate), the more difficult it is to control a temperature homogeneity or temperature inhomogeneity in the process item. The temperature inhomogeneity can lead to a mechanical stress in the process item and, therefore, to destruction of the process item. For this reason, the known appliance with the tempering container mainly suitable for tempering a single process item.

SUMMARY OF THE INVENTION

The object of the invention is to demonstrate how, using a single appliance, a plurality of process items can be simultaneously tempered while controlling a temperature homogeneity or temperature inhomogeneity in each of the process items.

In order to achieve the object, an appliance is specified for tempering a plurality of process items in a certain gas atmosphere by acceptance of a quantity of energy by a process item by means of absorption of a certain electromagnetic radiation and by acceptance of at least a further quantity of energy by at least one further process item by means of absorption of at least a further certain electromagnetic radiation. The appliance exhibits at least one device for producing the gas atmosphere, a tempering unit with at least one energy source for generating the electromagnetic radiation and at least one further tempering unit with at least one further energy source for generating the further electromagnetic radiation. The tempering unit and the further tempering unit are arranged relative to one another to form a tempering stack in such a way hat the process item can be arranged in a certain stacking direction of the tempering stack between the energy source and the further energy source and the further energy source can be arranged between the process item and the further process item.

The energy source is, for example, a heater plane, which is formed by a heater array. The heater array consists, for example, of rod-shaped halogen lamps or heating rods arranged parallel to one another. The process items are, for example, arranged between the heater planes in the tempering stack. Such an arrangement makes the appliance particularly suitable for the simultaneous tempering of a plurality of process items. The tempering units can be arranged both vertically and horizontally. At least one energy source is associated with each process item, the process item being arranged during tempering in the radiation field of the respective electromagnetic radiation. In order to accept the respective quantity of energy, the process items exhibit a corresponding absorption of the electromagnetic radiation. The arrangement ensures that each process item is provided with an energy density necessary for the tempering process. Mutual shadowing of the process items in the stack and, therefore, an uneven radiation of the process items due to the electromagnetic radiations does not occur. The (adjustable) gas atmosphere is, for example, characterized by a defined partial pressure of a gas or gas mixture (for example air). It is also conceivable for the gas atmosphere to be a vacuum.

In a particular embodiment, at least one of the tempering units exhibits at least one additional energy source for generating an additional quantity of energy and for accepting the additional quantity of energy by the process item of the tempering unit. The additional energy source makes it possible to take account of a different infrared absorption by the front surface and the rear surface of the process item and, by this means, to contribute to improving temperature homogeneity of the process item during the tempering process. In addition, an increase in the heating rate can be achieved by means of the additional energy source.

The acceptance of the additional quantity of energy can, essentially, take place by thermal conduction, thermal radiation and/or convection. In the case of thermal conduction, the process body is in contact with the energy source. Thermal radiation is at least partially absorbed by the process item and the process container in accordance with their absorption spectra within the spectral range of the heating element. In the case of convection, a gas for example, which can also be the process gas, is led past the process body. In this process, a quantity of energy can be exchanged between the gas and the process body.

In a particular embodiment, the additional energy source is an energy source for generating an additional electromagnetic radiation and the acceptance of the additional quantity of energy is an absorption of the additional electromagnetic radiation. In a further embodiment, the process item of the tempering unit is arranged between the energy source of the tempering unit and the additional energy source of the tempering unit. This makes it possible to heat different surfaces of the process item, for example an upper surface and a lower surface of a flat process item, differently. This is particularly advantageous when the process item is a multilayer body which exhibits layers of different material. The layers exhibit, for example, a different absorption capability for the electromagnetic radiation of the energy sources at the same thermal expansion coefficient. In order to avoid a temperature inhomogeneity in the thickness direction of the multilayer body, the layers are, for example, radiated with an electromagnetic radiation of different energy density (energy per unit area).

In a particular embodiment, the energy source, the further energy source and/or the additional energy source can be triggered independently of one another. The quantity of energy which is supplied to the process items or different layers of the process items can be individually adjusted or regulated. As an example, two adjacent tempering units are optically separated from one another, i.e. so that electromagnetic radiation of one tempering unit does not radiate into the adjacent tempering unit. This is, for example, achieved by a body, which is opaque or partially transparent to the electromagnetic radiation, between the tempering units. This body is, for example, a reflection body (see below). The process item is located between the energy source and the additional energy source so that, in addition, only these energy sources contribute to the tempering of the process item. The quantities of energy, which are supplied to the process item in the form of "upper heat" and "lower heat", can be adjusted individually in this way for the individual layers of the individual process item.

In a particular embodiment, the electromagnetic radiation, the further electromagnetic radiation and/or the additional electromagnetic radiation is infrared radiation (thermal radiation). An energy source of a thermal radiation with an intensity maximum at a wavelength of between 1 micron and 2 microns is conceivable. Such a heat source is, for example, a halogen lamp. Also conceivable is an energy source in the form of a resistance heating element which emits the thermal radiation. Such an element exhibits, for example, graphite, silicon carbide and/or a metal alloy such as nickel-chromium. Additionally conceivable is any electromagnetic radiation (microwaves, ultraviolet light) which can lead to heating of the process item.

In a particular embodiment, at least one of the tempering units exhibits at least one reflection body for forming a radiation field of at least one of the electromagnetic radiations. A flux density of an electromagnetic radiation onto a process item is controlled by the reflection body. In this process, the flux density is concentrated on the process item. The reflection body exhibits, for example, a material which at East partially reflects the electromagnetic radiation of the energy source. The reflection body can be arranged in such a that a reflected electromagnetic radiation is directed onto a process item. The reflection body of the tempering unit is, for example, arranged toward an adjacent tempering unit. In this way, the reflection body is located quasi between two tempering units. It is also conceivable for the reflection body to be arranged directly at an energy source. In this way, it is possible to adjust a certain opening angle, for example, of the radiation field electromagnetic radiation.

The reflection body can be opaque or almost opaque to the electromagnetic radiation of the energy source. For this purpose, the reflection body exhibits, for example, a high reflection capability with a simultaneous low transmission capability. In particular, the reflection body is partially permeable to at least one of the electromagnetic radiations. This is advantageous when each of the tempering units has respectively available only one energy source, for example in the form of a heater plane. Because of the reflection body, the electromagnetic radiation of a tempering unit reaches into an adjacent tempering unit and can, therefore, contribute to tempering the process item of the adjacent tempering unit. Material and thickness of the reflection body are selected in such a way that a transmission spectrum and reflection spectrum is located in the range of the wavelength of the electromagnetic radiation of the associated energy source. In this case, the absorption capability and emission capability of the process item is likewise taken into account. Transmission capability and reflection capability of the reflection body and absorption capability and emission capability of different sides of the process item are matched to one another in such a way that no unallowable temperature gradient in the process item (for example in the thickness direction of the process item) occurs during the tempering process. The temperature homogeneity is ensured during the tempering process. The material of the reflection body is selected in such a way that an optical property, such as the absorption capability or the reflection capability of the reflection body, remains essentially constant during the tempering process. Conventional reflective materials can be considered as the reflection body to suit the desired reflection spectrum. The reflection body is advantageously in ceramic, or in fused quartz. These materials are inert with respect to a number of process gases. The reflection body can also be a reflecting, chemically less active coating such as barium sulfate or aluminum oxide on a substrate in glass ceramic or quartz glass. It is, for example, also conceivable for a halogen lamp sleeve to exhibit the coating. Also conceivable is a reflection body with a metal coating.

In a further embodiment of the invention, at least one of the tempering units exhibits at least one means for cooling the process item. Associated with this is the advantage that a process procedure comprising various method steps with at least one heating phase and cooling phase can be carried out with the aid of the same appliance. The means for cooling is, in particular, a cooling gas and/or a cooling fluid. The cooling with the aid of the cooling gas takes place by convection, a cooling gas, which is cooler in comparison with the process item, for example, being led past the process item. The cooling can also take place by thermal conduction, the process item being in contact with a cooling body with a corresponding thermal conductivity coefficient. It is conceivable for the cooling body to be an envelope of the tempering unit and/or of the tempering stack, with a hollow space through which the cooling gas or the cooling fluid can be led.

In a further embodiment, at least one of the energy sources is arranged in an envelope, which is at least partially transparent to the electromagnetic radiation of the energy source. The envelope consists, for example, of quartz glass. The envelope is preferably vacuum-tight. The energy source can be protected from contact with a process gas by means of the envelope. A further advantage of this embodiment is simple changing of the energy source.

In a particular embodiment, the envelope of the energy source exhibits an optical filter for the electromagnetic radiation of the energy source. In this way, deliberate influence can be taken on the optical property (absorption capability and transmission capability) of the envelope.

In a particular embodiment, the envelope of the energy source exhibits means for cooling. In this arrangement, the means for cooling is, in particular, arranged in the envelope of the energy source. In this case, for example, not only the process item but also the energy source is cooled. This leads to a rapid reduction of an energy density radiated from the energy source and, therefore, to an efficient cooling of the process item. Particularly when high energy densities and/or high temperature homogeneity are required, the energy sources, in particular halogen lamps, are arranged at only a small distance from the process item so that, in addition to a high radiation intensity, a high level of cooling performance is also available. In the case of larger distances between the energy sources, additional cooling elements can be arranged between the energy sources in the case of high demands for cooling performance. Such a cooling element is, for example, a tube through which a cooling gas or a cooling fluid is led. A covering of the envelope, through which the cooling fluid flows for cooling purposes, is, for example, conceivable. Also conceivable is a combination of cooling gas and cooling fluid. In order to avoid a temperature shock, a cooling gas can be initially led through the intermediate space between covering and energy source. In a further step, the cooling fluid is pumped through the covering for efficient cooling. In a further embodiment, the envelope of the energy source exhibits the reflection body. In this case, the reflection body is, in particular, arranged in the envelope of the energy source. In this way, there is no sort of limitation with respect to the reactivity of the material of the reflection body relative to a process gas. The only decisive features are the optical properties of the reflection body.

In a further embodiment, the envelope of the energy source exhibits an optical filter for the thermal radiation of the energy source. in this case, the optical filter is, in particular, arranged in the envelope of the energy source. In this way, there is no sort of limitation with respect to the reactivity of the material of the optical filter relative to a process gas. The only decisive features are the optical properties of the filter. The optical filter can then be selected in such a way that the desired spectrum of the energy source is achieved.

In a particular embodiment, at least one of the tempering units exhibits a tempering container, exhibiting a container wall, for holding the process item of the tempering unit. In this case, the tempering unit is used to arrange the process item in the radiation field of one of the electromagnetic radiations. It is conceivable for the container wall itself to exhibit the energy source of the electromagnetic radiation. The wall is, for example, graphite, through which electrical current flows during the tempering process.

It can be particularly advantageous for a container wall, which functions as a support surface for the process item, to permit a release of the energy quantity to the process item by means of thermal conduction. For this purpose, the container wall exhibits a corresponding thermal conductivity. This is particularly advantageous when the process item exhibits a low absorption in the spectrum of the energy sources. The support surface then consists of a material which exhibits a high absorption in the spectrum of the energy source.

In a further embodiment, the tempering stack exhibits a stack body with a body wall. The stack body is, for example, used as a holding device for the tempering units and/or as a reflection body for the thermal radiation and/or as enveloping insulation body of the tempering stack. In a particular embodiment, the stack body can be tempered. A tempering rate of the process item can be additionally influenced by this means. The stack body is, for example, a frame with an insertion plane or an insertion rail for, in each case, a tempering unit, an energy source, a process item and/or a support surface of a process item.

The stack body advantageously exhibits a hollow space, which can be evacuated and can be filled with the process gas. In this case, the tempering units are arranged relative to the tempering stack in this hollow space. It is also conceivable for a body wall of the stack body to exhibit the container wall of the tempering container. In this way, the stack body can, for example, be essentially formed by the container walls of the tempering container. The tempering containers are stacked one above the other to form the stack body. In this case, the tempering containers can be designed, with the aid of holes and recesses, in such a way that a common hollow space of the tempering containers is present.

By means of the stack body, which can be evacuated and can be filled with the process gas, a common process gas atmosphere for all the process items arranged in the tempering containers can be created. This embodiment can be advantageous when a large quantity of process gas is necessary at the smallest possible gas flow.

In a further embodiment, the tempering stack and/or the stack body are arranged in a tempering chamber with a chamber wall. In a further embodiment, the tempering chamber can be evacuated and can be filled with the process gas. The tempering chamber has available, for example, a door which can be closed and through which the tempering containers, which are located in the tempering chamber, can be loaded with the process items. It is also conceivable that the stack body can be inserted into the tempering chamber through the door. A tempering unit can likewise be directly pushed into a tempering chamber on an appropriate rail. The tempering chamber functions as holding device for the tempering units.

The tempering chamber is, in particular, provided with a vacuum-tight door, on which, within the tempering chamber, a door of the stack body is arranged, which door can be opened and closed independently of the door of the tempering chamber. In this way, the gas atmosphere in the stack body and also in the tempering containers can be easily controlled without the tempering chamber having to be opened.

The tempering chamber and/or the stack body can, in particular, be tempered. This is particularly advantageous when a processing educt and/or product condenses during tempering on a surface of the stack body and/or of the tempering chamber. A gas pressure within the tempering chamber can, in addition, be controlled. In order to increase a power density of the respective electromagnetic radiation, the stack body and/or the tempering chamber can exhibit a reflection body or a reflection coating.

In a particular embodiment of the invention, the container wall, the body wall and/or the chamber wall exhibit the device for producing the gas atmosphere. The device is, in particular, a gas opening for at least one gas for evacuating and/or filling the tempering container, the stack body and/or the tempering chamber with the gas. The gas is, in particular, a process gas and/or a scavenging gas. All conceivable corrosive and non-corrosive gases can be considered as the process gas. Examples for this are oxidizing gases such as oxygen or a molecular halogen and reducing gases such as hydrogen, hydrogen sulfide, hydrogen selenide, doping gases or the like. It is, for example, conceivable for a first process gas to be necessary during the tempering process in a firsttempering stage whereas a further process gas is necessary during a further tempering stage. It is also conceivable for the process gas to have to be topped up within a tempering stage. Nitrogen or another inert gas can be considered as the scavenging gas. It is used for cleaning the tempering container, the stack body and/or the tempering chamber. In addition, vacuum can be applied for the cleaning and/or for the processing or tempering.

In a further embodiment, the process item and the further process item are in contact with one another through the gas opening. As an example, a gas outlet of the tempering chamber is connected to a gas inlet of a further tempering container. This produces a common gas atmosphere in the two tempering containers. Both process items can, for example, be brought into contact with the same gas flow. It is, however, also possible for each tempering container to be provided with its own gas inlet and gas outlet.

The possibility of evacuating and for filling the tempering container, the stack body and or the tempering chamber is particularly advantageous where a toxic and/or corrosive process gas is used. Last but not least, an inspection of the respective process gas atmosphere and cleaning of the container is important for safety reasons when such gases are used.

In a further embodiment, at least one of the process items is a multilayer body with at least one layer which exhibits a certain absorption of at least one of the electromagnetic radiations.

In a particular embodiment, at least one of the tempering units exhibits at least one transparent body, which exhibits a certain absorption and a certain transmission for at least one of the electromagnetic radiations and which is arranged in the radiation field of the electromagnetic radiation between the energy source of the electromagnetic radiation and one of the process items. The particular advantage of the transparent body, in particular when tempering a multilayer body, is dealt with further below in association with the tempering unit embodiment.

In a particular embodiment, the envelope of the energy source, the tempering container, the stack body, the tempering chamber, the transparent body and/or the reflection body exhibit a material which is inert with respect to the gas. The material is, in particular, from the group of glass, quartz glass, fused quartz, ceramic, glass ceramic and/or metal. These materials are inert with respect to a number of process gases, i.e. they are less active. In addition, some materials such as quartz glass or glass ceramic have a low thermal expansion coefficient. This is particularly important in the case of an appliance which is composed of constituent parts in different materials. A dimension of a constituent part can change within a permissible tolerance. This ensures that the appliance is not destroyed because of a mechanical stress during the tempering process, i.e. it is kept. In addition, this facilitates an inspection of a gas atmosphere. A possible gap in a constituent part or between the constituent parts of the appliance scarcely changes during the tempering process because of the low thermal expansion coefficients of its constituent parts. An additional advantage is provided by the use of a material which can be machined (for example ceramic or glass ceramic which can be machined or fused quartz which can be machined).

The way in which various embodiments of the tempering unit ensure that large-area process items, in particular multilayer bodies with an asymmetrical layer sequence, can be tempered while controlling atemperature homogeneity of the process item is described below.

The process item of the tempering unit is, for example, a multilayer body which exhibits a first layer and at least a second layer. The tempering takes place by the multilayer body accepting a quantity of energy with the first layer accepting a first partial quantity of the quantity of energy and the second layer accepting a second partial quantity of the quantity of energy. The tempering unit, which exhibits at least one energy source for the quantity of energy, is wherein the first layer is arranged between a first energy source and the second layer and the second layer is arranged between a second energy source and the first layer. At least one of the energy sources exhibits an emission of a certain electromagnetic radiation with a radiation field and at least one of the layers exhibits a certain absorption for this electromagnetic radiation and is arranged in the radiation field. In addition, at least one transparent body, which exhibits a certain transmission and a certain absorption for the electromagnetic radiation, is arranged in the radiation field between the energy source with the radiation field and the layer, which exhibits the absorption of the electromagnetic radiation and which is arranged in the radiation field.

The transparent body makes it possible to heat the layers of the multilayer body individually, i.e. to specifically control, to regulate and/or to adjust in advance the partial quantity of the quantity of energy which a layer accepts. A quantity of energy is, for example, determined with the aid of a control circuit during the tempering process (see below). It is also conceivable for an adjustment in advance of the energy sources (for example energy density, type of energy, etc) to be sufficient without an additional control circuit. An individual heating of the layers of the multilayer body is also possible in the case of very high heating rates of between 1° C. per second and, for example, 100° C. per second and above. The individual heating makes it possible to keep the mechanical stresses—and a deformation of the multilayer body occurring, under certain circumstances, because of it—as small as possible during the tempering process.

The basis for this is the transparent body which is, optically, partially permeable (semi-transparent). Due to the transmission which, for example, lies at a certain wavelength between 0.1 and 0.9, the electromagnetic radiation described above passes through the transparent body onto a layer. The layer can accept a corresponding quantity of energy or partial quantity of the quantity of energy, which is emitted directly from the energy source.

The transparent body also exhibits a certain absorption for the electromagnetic radiation. The energy absorbed in this way can be rejected to the surroundings in the form of thermal radiation and/or thermal conduction. In a particular embodiment, the appliance for tempering a multilayer body has a transparent body available which, due to the absorption of the electromagnetic radiation, exhibits a thermal radiation and/or thermal conduction in the direction of the multilayer body. This makes it possible to temper a layer by thermal radiation and/or thermal conduction. It is also conceivable for a first layer of the multilayer body, which exhibits transmission for the thermal radiation, to be tempered, essentially, by thermal conduction only whereas a second layer of the same multilayer body can be essentially tempered by the thermal radiation of the same transparent body. A first layer with corresponding transmission is, for example, a glass layer. When an electromagnetic radiation of an energy source and/or a transparent body meets the glass body, a small proportion of the radiation(approximately 4%) is reflected. The major proportion (more than 90%) passes more or less unhindered through the glass and then meets a second layer of the multilayer body. This radiation can be absorbed there and leads to an acceptance of a quantity of energy by this second layer. The glass layer cannot be tempered sufficiently rapidly by radiation or thermal radiation at a very high heating rate. On the other hand, a relatively rapid tempering is possible by thermal conduction if the transparent body can accept a partial quantity of the quantity of energy and transfer it to the glass layer.

The case where the transparent body is itself a layer of the multilayer body is also conceivable. The transparent body can accept a partial quantity of the quantity of energy by absorption of a part of the electromagnetic radiation and, by transmission, permit a further partial quantity of the quantity of energy to pass through for acceptance by a further layer.

In a particular embodiment of the tempering unit, a layer of the multilayer body is a substrate for at least one further layer of the multilayer body. The multilayer body exhibits, in particular, an asymmetric layer sequence. The multilayer body consists, for example, of a substrate coated on one side. Individual layers of the multilayer body can also be arranged adjacent to one another.

In a particular embodiment, a layer of the multilayer body exhibits a material which is selected from the group of glass, glass ceramic, ceramic, metal and/or plastic. Temperature-resistant plastic such as Teflon can, in particular, be considered as the plastic. One layer is, for example, a metal foil. The metal foil can also function as substrate.

The partial quantity of the quantity of energy, which is accepted by a layer, depends for example on the absorption, emission and/or reflection capability of the layer. It also depends, however, on the type of the energy source and on the way in which the quantity of energy is transmitted to the multilayer body or to a layer of the multilayer body.

One of the energy sources of the tempering unit is, for example, an energy source for thermal energy. In this arrangement, the thermal energy can be supplied direct to the layer. In this case, thermal radiation, thermal conduction and/or convection can be considered. In the case of the thermal radiation, the energy source itself can be a source for thermal radiation. The thermal radiation is, for example, electromagnetic radiation in the wavelength range between 0.7 and 4.5 microns. The corresponding layer is arranged in the radiation field of the energy source. The layer is subjected to the electromagnetic radiation of the energy source and absorbs, at least partially, the electromagnetic radiation.

It is, however, also possible for any given energy, which is converted into thermal energy in the layer, to be supplied to a layer. As an example, a layer is subjected to radiation by high-energy ultraviolet light which the layer absorbs. Due to an absorption of a high-energy light quantum, a molecule of the layer or the complete layer attains an electronically excited state. Energy accepted in this process can be converted into thermal energy.

In addition to thermal radiation and thermal conduction, tempering of a layer or the complete body is also possible by convection. In this process, a gas with a certain energy is led past the layer, with the gas rejecting the energy to the layer. Gas which is led past can simultaneously function as process gas.

Furthermore, the layer can also be cooled by thermal conduction and/or convection. In this case, a negative thermal energy is supplied to the layer. In this way, it is also possible to control the quantities of energy or the partial quantities of the energy quantities and, for example, to additionally influence the mechanical stresses in the multilayer body.

In a particular embodiment, an energy transmitter for transmitting the quantity of energy onto the multilayer body is present. The energy transmitter functions as a secondary energy source. The energy transmitter absorbs, for example, electromagnetic radiation of a primary energy source, for example a halogen lamp, from a high energy range and converts this electromagnetic radiation into thermal radiation, which is absorbed by the layer.

The indirect and/or direct surroundings of the multilayer body can function as energy transmitter during the tempering process. It is conceivable for an energy transmitter to be arranged with the multilayer body for tempering in an internal space of a tempering chamber. The energy transmitter can also be arranged outside the tempering container, for example on a wall of the tempering container or at a distance from the tempering container. It is conceivable for the energy transmitter to be a coating of the tempering container. The energy transmitter is, for example, a graphite foil. The tempering container can also itself undertake the function of an energy transmitter. Such a function is, for example, provided by a graphite tempering container. Finally, the transparent body is nothing other than an energy transmitter. A gas likewise functions as energy transmitter in the case of an energy transmission by convection.

An energy quantity which is accepted by the multilayer body can differ not only from layer to layer but also within a layer. As an example, an edge effect occurs in the multilayer body or in a layer of a multilayer body during the tempering process. An edge region of the layer exhibits a temperature different from that of an inner region of the layer. A lateral temperature gradient appears during tempering. This occurs, for example, when a radiation field of the energy source is inhomogeneous. In this case, an energy density of the radiation field on a surface, through which the radiation radiates, is not the same everywhere. A lateral temperature inhomogeneity can also appear in the case of a homogeneous radiation field if, at the edge of a layer, because of the larger absorbing area per unit volume, a larger quantity of energy is absorbed per unit volume. In order to even out the temperature difference, an energy source can, for example, be used which consists of a number of sub-units. Each sub-unit can be separately triggered and, by this means, each quantity of energy supplied from a sub-unit to a layer can be separately adjusted. Such an energy source is, for example, an array or a matrix of individual heating elements. A heating element is, for example, a halogen lamp. The array or the matrix can also be used to produce a lateral temperature gradient in the layer. In this way, it is for example possible to specifically generate a permanent or transient deformation of the layer body. In particular, an array or a matrix is very advantageous for the tempering process of a multilayer body in which layers are located adjacent to one another.

With respect to the energy source, it is advantageous for the energy source or the energy sources to operate in continuous operation. It is, however, also conceivable for the energy sources to make available the quantity of energy or the partial quantities of the quantity of energy to the layers in a cyclic operation and/or pulse operation. Such an energy source is, for example, an energy source with pulsed electromagnetic radiation. In this way, a quantity of energy can be supplied to the layers at the same time or in a time sequence (for example alternating).

The following properties of an energy source for electromagnetic radiation are particularly advantageous:

The energy source exhibits a homogeneous radiation field.

A spectral intensity distribution of the energy source partially overlaps a spectral absorption of the layer, of the transparent body and/or of a possibly present tempering container (see below).

In the presence of a process gas, the energy source is corrosion resistant and/or protected against corrosion.

The energy source exhibits a high energy density, which is sufficient to heat a mass of the multilayer body (and possibly of a tempering container) at a heating rate of more than 1° C. per second.

In a particular embodiment, the transparent body of the appliance exhibits at least one distance holder, with which the multilayer body is in contact, for accepting a laterally homogeneous energy quantity through the multilayer body. As an example, the layer by means of which the multilayer body is in contact with the transparent body or the distance holder is mainly tempered by a homogeneous thermal radiation. In this form, the distance holder preferably exhibits a material which exhibits a low absorption for the electromagnetic radiation. A distance holder protrudes, for example, beyond a surface of the transparent body by between some microns and up to millimeters.

The layer in contact with the distance holders can also be mainly tempered by thermal conduction. For this purpose, the distance holders have available, for example, a thermal conductivity necessary for a corresponding tempering rate. It is also conceivable for the distance holder to exhibit a high absorption for an electromagnetic radiation for the energy transmission by thermal conduction, the electromagnetic radiation being efficiently converted into thermal energy.

The transparent body exhibits, in particular, a number of distance holders. In the case of a number of distance holders, which are arranged uniformly in contact between the layer of the multilayer body and the transparent body, a homogenization of the lateral temperature distribution can be additionally achieved.

In a particular embodiment, the transparent body and/or the distance holder exhibits a material which is selected from the group of glass and/or glass ceramic. Glass ceramic exhibits various advantages:

It can be employed for tempering in a wide temperature range from, for example, 0° C. to, for example, 700° C. Glass ceramic exhibits, for example, a softening point which is located above the temperature range.

It has available a very low thermal expansion coefficient. It is resistant to temperature shock and is distortion-free in the temperature range, mentioned above, of the tempering process.

It is chemically inert with respect to a number of chemicals and exhibits a low permeability for these chemicals. Such a chemical is, for example, the process gas, to which a layer and/or the complete multilayer body is exposed during the tempering process.

In the spectral range of many energy sources, it is optically partially permeable for electromagnetic radiation, in particular in a wavelength range in which the radiation density of the energy sources is high. Such a radiation source is, for example, a halogen lamp with a high radiation density between 0.1 and 4.5 microns.

Glass, in particular quartz glass, is likewise conceivable as material for the transparent body. An advantageous feature here is a high employment temperature of up to 1200° C. In the spectral range of an energy source in the form of a halogen lamp, these materials exhibit high transmission and low absorption. The light passes essentially unhindered through these transparent bodies and reaches a layer with a corresponding absorption for the electromagnetic radiation, the layer accepting a quantity of energy and being heated. The transparent body remains practically unheated due to the radiation.

In a process application, it is possible for material of the heated layer to evaporate and be precipitated on a relatively cold surface of the transparent body. In order to prevent this, care can be taken to ensure that the transparent body is heated to the necessary temperature during the tempering process. This is achieved by a transmission of a quantity of energy onto the transparent body by thermal conduction and/or convection. Also conceivable is an electromagnetic radiation which the transparent body absorbs. It is conceivable for the transparent body to exhibit a coating which absorbs a certain part of the electromagnetic radiation. The energy accepted by this means can be fed onto the glass or quartz glass transparent body. In this form, the transparent body, consisting of the glass body with the coating, is optically partially permeable and can be employed for energy transmission by both thermal radiation and thermal conduction onto the multilayer body.

In a particular embodiment, at least one layer of the multilayer body is in contact with a process gas. It is also conceivable for the complete multilayer body to be exposed to the process gas. An inert gas (molecular nitrogen or noble gas) can, for example, be considered as process gas. The process gas does not react with a material of the layer. A process gas, which reacts with a material of the layer, is however also conceivable. The functional layer forms by the action of the process gas. The process gas acts, for example, in an oxidizing or reducing manner relative to a material of the layer. Possible process gases for this purpose are oxygen, chlorine, hydrogen, elementary selenium, sulfur or a hybrid. It can also be an etching process gas such as HCL or the like. Further examples of the process gas are $H_2S$ and $H_2Se$, which are employed in the manufacture of a thin-film solar cell (see below). Finally, all gases or also gas mixtures which react in a corresponding manner with a material of a layer are conceivable.

It is advantageous for the layer to be exposed to a defined process gas atmosphere. The defined process gas atmosphere comprises, for example, a partial pressure of the process gas or process gases during the tempering process. It is also, for example, conceivable for a layer or the multilayer body to be in contact with a vacuum for the tempering process.

A defined process gas atmosphere can, for example, be achieved by the process gas being led past the layer with a certain velocity. In this case, a process gas can act on the layer with different partial pressures in the course of the tempering process. It is also conceivable for different process gases to be sequentially in contact with the layer of the layer body.

At least the layer which is in contact with the process gas is preferably enclosed. This is, for example, achieved by a layer envelope, it being possible to fasten the envelope on the substrate. The envelope is filled with the process gas before or during the tempering process. In this case, the process gas is concentrated on a surface of the layer whose properties are to be influenced by the process gas. This can prevent surroundings being contaminated by the process gas. This is particularly important in the case of a corrosive and/or poisonous process gas. In addition, it is possible to operate with a stoichiometric quantity of process gas necessary for a conversion of the layer. Process gas is not unnecessarily consumed.

In a particular embodiment of the invention, the multilayer body is arranged in a tempering container. In this arrangement, at least one container wall of the tempering container exhibits a transparent body. The tempering container has the advantage that it automatically represents the envelope of the layer or of the complete multilayer body.

The envelope does not need to be fastened to the multilayer body. In the case of a tempering container which can be closed, the process gas atmosphere can be specifically and easily adjusted. The tempering container offers, for example, a sufficiently large volume for the process gas required during the tempering process. If the tempering process demands a homogeneous and reproducible distribution of the process gas over a layer, a gas outlet from the tempering container can also be specifically adjusted. This can, for example, be necessary when tempering takes place at a very high heating rate. In this case, the process gas expands. If the tempering container cannot withstand the gas pressure then occurring, a deformation of the tempering container or even destruction of the tempering container occurs. A deformation should, however, be prevented when, for example, the multilayer body is in contact with the bottom of the tempering container. A deformation of the tempering container can lead to a lateral temperature inhomogeneity in the multilayer body. The tempering container can additionally be transport means for the multilayer body during the tempering process. The tempering container has the advantage that during the tempering process, for example, a fracture of a glass layer (carrier layer or substrate)cannot be excluded. In the case of a fracture of such a substrate, the broken material can be easily removed from the tempering unit or from the appliance for tempering. This contributes to tempering process stabilization.

In a particular embodiment, the container wall of the tempering container, which exhibits the transparent body, is a cover and/or a bottom of the tempering container. The multilayer body is located with a layer directly on the transparent body of the bottom, for example. The transparent body can, as described above, exhibit distance holders. The cover likewise exhibits the transparent body which, for example, is not in contact with the multilayer body or a layer of the multilayer body. In this way, the layer of the multilayer body, which is in contact on the bottom, can be heated by thermal conduction, the layer facing toward the cover can be heated by thermal radiation. The layer facing toward the cover can be easily exposed to a process gas.

In a further embodiment, the bottom and/or the cover of the tempering container is respectively formed by at least one multilayer body. In this arrangement, the layer of the multilayer body, which has for example to come into contact with the process gas, is directed into an internal space of the tempering container. This solution is possible if the multilayer body or the layers of the multilayer body exhibit a low thermal expansion coefficient and/or the tempering rate is small. In the case of a high tempering rate, the multilayer body advantageously has available a substrate with a high thermal conductivity coefficient. The substrate is directed toward the outside. In this case, the substrate is, for example, a transparent body as described above.

In a particular embodiment, the tempering container, the transparent body and/or the energy transmitter exhibits a material which is inert relative to the process gas. It is also advantageous for the complete process surroundings of the tempering process to be inert relative to the process gas used. The process surroundings also include, for example, the energy source (primary energy source).

The material is selected as a function of the process gas. Glass, glass ceramic and ceramic are, for example, conceivable. A fiber-reinforced material, such as carbon fiber reinforced graphite can likewise be used. Also conceivable is a material such as SiC, which exhibits a high thermal conductivity coefficient. The tempering container can consist of a metal or an alloy. A plastic which can resist up to a certain temperature is likewise possible.

In addition to chemical inertness relative to the process gas, the following properties for the material of the tempering container are of advantage:

The material of the tempering container is distortion-free under the tempering conditions. It is, in addition, resistant to temperature shock. This is particularly the case when it exhibits a lower thermal expansion coefficient.

The thermal softening point of the material of the tempering container is located above a maximum temperature of the tempering process.

The tempering container exhibits a low or defined permeability relative to a process gas.

In a particular embodiment, a device is present for detecting a measure of at least one physical parameter, dependent on the tempering process, of the appliance and/or a tempering unit for regulating the first and second partial quantity of the quantity of energy.

A conceivable parameter is an absorption, transmission and/or reflection property of a layer. The measure of the parameter is the value of the parameter. As an example, a wavelength of an absorption maximum can depend on the temperature. In this case, the measure of the parameter would be the corresponding wavelength.

The parameter is, in particular, a temperature of the multilayer body. In this case, the measure is a value of the temperature. Also conceivable is the detection of the temperature of a layer of the multilayer body, of the transparent body and/or of the tempering container or of a container wall of the tempering container. At least one parameter of the multilayer body and/or of a layer can be continuously detected during the tempering process. On the basis of the detected temperature of a layer, for example, the partial quantity of the quantity of energy, which is accepted by the layer, is increased or lowered. By this means, a temperature inhomogeneity or a temperature gradient in the thickness direction of the multilayer body can be avoided. This temperature inhomogeneity can also, however, be increased if this should be necessary.

As an example, the device for detecting the temperature is be a pyrometer which is directed onto the layer. The pyrometer detects, for example, the thermal radiation which is emitted by the layer. Conclusions on the temperature of the layer can be drawn on the basis of the thermal radiation. Also conceivable is a temperature detector which is connected to the layer and is tempered by thermal conduction.

It is also conceivable for the temperature of the layer or of the multilayer body not to be measured directly but to be measured indirectly. As an example, a pyrometer is directed onto the tempering container in which the multilayer body is tempered. The temperature of the tempering container can be influenced by the temperature of the multilayer body. Conclusions on the temperature of the layer of the multilayer body are drawn on the basis of the temperature of the tempering container. The quantity of energy or the partial quantity of the quantity of energy is regulated on the basis of the measured temperature of the tempering container. For this purpose, a sort of "calibration measurement" has to be carried out before the tempering operation; this calibration provides a relationship between measured temperature of the tempering container and actual temperature of the layer or of the layer body. The "calibration measurement" gives a required value of the temperature. The actual value is detected. A comparison between required value and actual value supplies. a regulation parameter for regulating the quantities of energy.

The detection (and also the regulation of the partial quantities of the quantity of energy) takes place, in particular, by means of a local resolution in the thickness direction of the multilayer body and by means of a time resolution in the time frame of the tempering process. As an example, the multilayer body is heated at a tempering rate of 25° C. per second. Both the detection and the regulation of the partial quantities of the quantity of energy would then take place so rapidly that a temperature difference between the layers of the multilayer body remains, for example, below a specified maximum during the tempering process. In association with a transient deformation of the multilayer body, the temperature inhomogeneity in the thickness direction can also lead to a lateral temperature inhomogeneity in the multilayer body. Within a layer of the multilayer body, lateral signifies, for example, at right angles to the thickness direction. The multilayer body lies, for example, on a graphite bottom. The supply and the acceptance of the quantity of energy by the layer of the multilayer body incontact with the bottom takes place by thermal conduction. A transient deformation of the multilayer body in the form of bending of the multilayer body can occur due to a temperature inhomogeneity in the thickness direction. In this case, the contact between the multilayer body and the bottom of the tempering container, which is necessary for the thermal conduction, is partially broken. As a consequence of this, a lateral temperature inhomogeneity of the layer or of the multilayer body in contact takes place. It is therefore particularly advantageous for a local resolution to be present for the detection of the parameter (and regulation of the quantities of energy) not only in the thickness direction but also laterally.

In a particular embodiment, the parameter is a deformation of the multilayer body. A deformation can occur on the basis of a temperature inhomogeneity which appears. The multilayer body is, for example, given a concave curvature. The multilayer body lies, for example, on the bottom of a tempering container. Due to the concave deformation, a distance between the contact surface and the multilayer body occurs in the edge region of the multilayer body. A measure of such a deformation can, for example, be detected by means of a device for laser interferometry or laser light reflection. The regulation of the quantities of energy takes place on the basis of the measure. It is advantageous for the measure to be recognized at an early stage of the deformation and to be rapidly reacted to.

For a device, as discussed, for the detection of a measure of a parameter dependent on the tempering process with the aid of an optical device (for example laser), it is advantageous for the layer to be investigated to be accessible to light of the optical device and for a detection signal to be unambiguously associated with the parameter to be detected. The wavelength of a laser should, for example, differ sufficiently from the thermal radiation of the multilayer body. If the appliance is equipped with a tempering container, it would be advantageous for the transparent body to be sufficiently permeable to the light of the laser.

Using the appliance, it is also possible to achieve a desired deformation of the multilayer body. For this purpose, it can be sensible to follow the deformation, as described above, during the tempering process. It is, for example, possible to produce a curved thin-film solar cell. For the desired deformation, the multilayer body is laid, for example, on a corresponding mold or mask. The mold or mask can be a direct energy source. The multilayer body is heated beyond a softening point of the substrate. As a result of this, the multilayer body takes on a shape corresponding to the mask or the mold. The mask is integrated, for example, in a bottom of the tempering container. The mask could, for example, be the transparent body.

In order to achieve the object, a method is provided, in addition to the appliance, for tempering a process item and at least one further process item while using the appliance described. The method exhibits the following method steps: a) arranging the tempering unit with the process item and the further tempering unit with the further process item to form the tempering stack and b) tempering the process item and the further process item.

In particular, the tempering process comprises at least one heating procedure and/or at least one cooling procedure of the process item and/or of the further process item. It is, for example, conceivable for a plurality of heating phases and a plurality of cooling phases to be passed through during the tempering process. The method is then particularly suitable for carrying out the tempering of the process items under a process gas atmosphere. For this purpose, the first process item and/or the further process item is brought into contact with at least one process gas. It/they can be brought into contact before, during or after the tempering process. In this case, one of the process items can be brought into contact simultaneously with a plurality of process gases (gas mixture). It is also conceivable for the process item to be brought into contact in sequence with various process gases and/or scavenging gases. This permits a variable process gas profile (time sequence of different partial pressures of the process gas or process gases). In this way, it is for example possible to employ both oxidizing and reducing process gases or to specifically introduce a doping material into the process item.

In a particular embodiment, the following process steps are provided: c) arranging the tempering stack in a hollow space of a stack body, d) arranging the stack body in a tempering chamber at a distance from the tempering chamber, so that an intermediate space occurs between the stack body and the tempering chamber, and e) producing a gas pressure of a scavenging gas in the intermediate space. These process steps take place before the tempering process. The intermediate space with the scavenging gas functions as a buffer so that the process gas, which is located in the hollow space, does not reach the tempering chamber or only reaches it when diluted. Contamination or corrosion of the tempering chamber can be prevented. The selection of the material of the tempering chamber is almost independent of the process gas. The intermediate space can be filled once with scavenging gas. It is also conceivable for a continuous scavenging gas flow to be led through the intermediate space, which scavenging gas flow is possibly removed from the process gas emerging, from the intermediate space, from the stack body. Removal of emerging process gas is also achieved because a pressure drop is generated from the hollow space of the stack body to the intermediate space. In a particular embodiment, a gas pressure of a scavenging gas is generated in the intermediate space between tempering chamber and stack body, which gas pressure is larger than the gas pressure in the hollow space of the stack body. For this purpose, gas outlet openings are preferably provided in the stack body, which, for example, are led to the outside via a collecting tube conduit through the intermediate space and through the tempering chamber and are there led, for example, into a gas removal unit. The pressure, which is also present in the gas removal unit (for example atmospheric pressure) is therefore approximately present in the hollow space of the stack body. The effect of this arrangement can be designated as gap counterflow scavenging, which is used to retain an inert gas counterflow against the process gas flow which is diffusing out at a gap of a lead-through of the stack body, for example at an envelope of an energy source, or at a joint gap of a component of the stack body. The objective of this is to prevent a condensation of process gases on the tempering chamber walls or a corrosion of the tempering chamber walls. The latter can, in any case, also be achieved by a suitable coating of the tempering chamber walls.

The gap counterflow scavenging takes place in accordance with the following principle. The tempering containers filled with the process gas are arranged in the stack body. The possibility cannot be excluded that the process gas may pass into the hollow space of the stack body. The hollow space of the stack body and the intermediate space between stack body and tempering chamber are in connection through small gaps or openings. A pressure gradient from the intermediate space to the hollow space of the stack body is built up by the selection of the gas pressures. This, for example, takes place by extracting the scavenging gas of the hollow space and/or introduction of the scavenging gas into the intermediate space and a pressure build-up, caused by this, relative to the pressure of the hollow space which, as described above can be in contact with the surroundings of the appliance of the tempering process. As a result, there is a scavenging gas flow from the intermediate space to the hollow space. The process gas does not reach the chamber wall of the tempering chamber. By this means, in particular, a tempering chamber temperature, the gas pressure of the hollow space and/or the gas pressure of the intermediate space are adjusted during the tempering process. In a particular embodiment, a multilayer body with a layer and at least one further layer is used as process item and/or further process item. In this case, the tempering process takes place by acceptance of a quantity of energy by the multilayer body with an acceptance of a first partial quantity of the quantity of energy by the first layer and an acceptance of a second partial quantity of the quantity of energy by the second layer, at least one energy source being used to supply the quantity of energy to the multilayer body. In this process, an appliance previously described is, in particular, used. The method steps are: arranging the multilayer body between a first and at least one second energy source, so that the first layer is arranged between the first energy source and the second layer and the second layer is arranged between the second energy source and the first layer, at least one energy source for a certain electromagnetic radiation with a radiation field being used as the energy source, and at least one of the layers absorbing the electromagnetic field and being arranged in the radiation field of the energy source, and arrangement of a transparent body in the radiation field of the energy source between the energy source and the layer, which is located in the radiation field of the energy source and which absorbs the certain electromagnetic radiation and tempering of the multilayer body.

In a particular embodiment, the transparent body absorbs a certain quantity of energy and supplies the quantity of energy to the layer. In a further embodiment, detection of a measure, dependent on the tempering process, of a physical parameter of the multilayer body is carried out during the tempering process in order to regulate the acceptance of the quantity of energy during the tempering process and to regulate the first and second partial quantities of the quantity of energy. In a particular embodiment, the transparent body supplies the quantity of energy to the layer by thermal conduction and/or thermal radiation.

In a particular embodiment, a multilayer body is used with a layer which exhibits copper, indium, gallium and/or selenium. A multilayer body with, in particular, a substrate in glass and/or metal is used. The substrate can, for its part, exhibit a coating (for example a metal layer on a glass plate). A gas, which is selected from the group of $H_2S$, $H_2Se$, $H_2$, He and $N_2$, is used as the process gas. The method is used particularly for producing a photovoltaic thin-layer chalcopyrite absorber of a solar cell and/or a solar module. A number of individual solar cells connected in series is present in the solar module. The glass is preferably soda lime glass. The corresponding layer functions as substrate. On the substrate, a molybdenum layer as electrode and, over the molybdenum layer, a functional layer, namely a copper-indium-galium-sulpho-selenide (CIGSSe) semiconductor layer, is applied. A thickness of the layer body, consisting glass body and semiconductor layer is typically between 2 and 4 mm, with a molybdenum layer of approximately 0.5 microns and a semiconductor layer of approximately 3 microns. The range given for the thickness of the multilayer body does not have to be used exclusively. The limiting factor is a capability of manufacturing a large substrate which is, as far as possible, plane and, therefore, can be processed to a multilayer body with the appliance described and with the method described.

Summarizing, the invention provides the following advantages:

A plurality of process item can be tempered simultaneously under changing process gas atmosphere. In the process, a heating profile and/or cooling profile of the tempering process can be variably configured.

A process item in the form of a large-area multilayer body with an asymmetrical layer build-up (for example multilayer body with a single layer on a substrate) can be tempered at a high tempering rate of more than 1° C. per second.

The layers of the multilayer body can, in this system, exhibit a greatly differing thermal conductivity coefficient and/or a greatly differing emission capability.

By means of a resolution in time and location of the detection and the regulation of a measure of a parameter dependent on the tempering process, tempering can be achieved particularly reliably. As an example, it is possible to react to a change in a property of the process item (for example emission or absorption capability) during the tempering process and, thereupon, to adjust the process parameters (pressure, temperature, energy density, etc).

Tempering to near a softening point of a substrate is possible.

Rapid tempering of between 1° C. per second and up to 100° C. per second is possible. In this process, temperatures of, for example, 1100° C. can be achieved.

When tempering beyond the softening point of the substrate, permanent deformation of the multilayer body is possible.

Defined tempering surroundings with a defined process gas atmosphere can be created. Different process gases with different partial pressure profiles can be adjusted simultaneously or sequentially before, during and/or after the processing. A toxic and/or corrosive process gas can, in particular, be employed. Condensation of a process substance on the chamber walls can be avoided.

All method steps necessary for the processing can be carried out with a single appliance.

BRIEF DESCRIPTION OF THE DRAWINGS

Using a plurality of embodiment examples and the associated figures, an appliance for tempering a process item and a corresponding method for this are presented. The figures are diagrammatic and do not represent true-to-scale illustrations.

FIG. 1 shows, from the side, a cross section through an appliance for tempering at least one process item.

FIGS. 2a to 2f show possible embodiments of the tempering unit.

FIG. 3 shows an excerpt from the tempering stack, the process items of two tempering units being connected together by means of passage openings.

DESCRIPTION OF THE PREFERRED EMBODIMENTS

Figure 4:
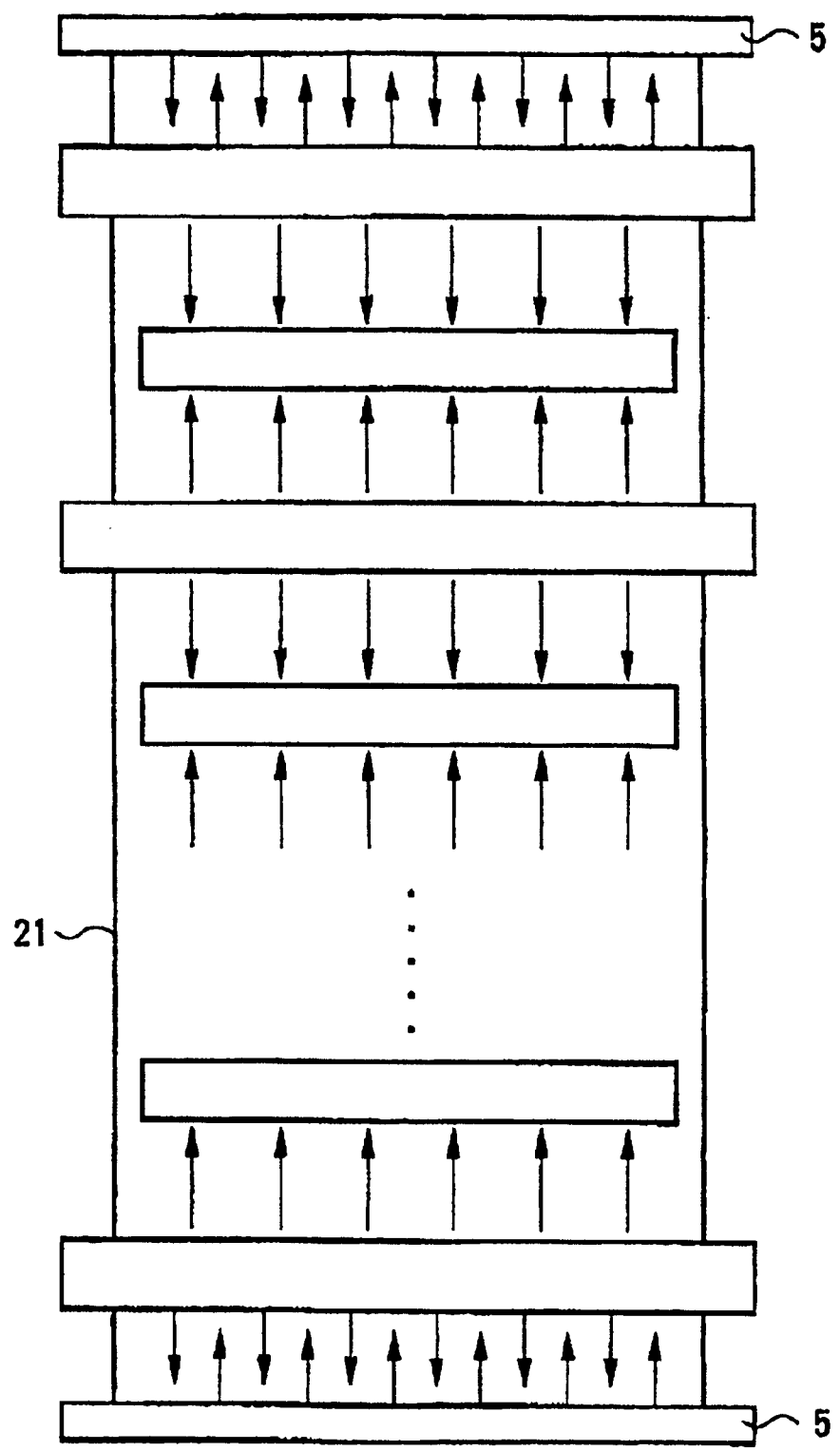
FIG. 4 shows a closed stack body which can be evacuated and can be filled with gas.

The starting point is an appliance 1 for tempering a plurality of process items 33 and 43 (FIG. 1). The appliance consists of a plurality of tempering units 3 and 4 arranged one above the other to form a tempering stack 2. A tempering unit 3 and 4, respectively, exhibits an energy source 32 and 42, respectively. In order to temper the process items, the energy sources and the process items are arranged on one another in such a way that, in a certain stack direction 22 of the tempering stack 2, the process item 33 is arranged between the energy source 32 and the further energy source 42 and the further energy source 42 is arranged between the process item 33 and the further process item 43.

Figure 6:
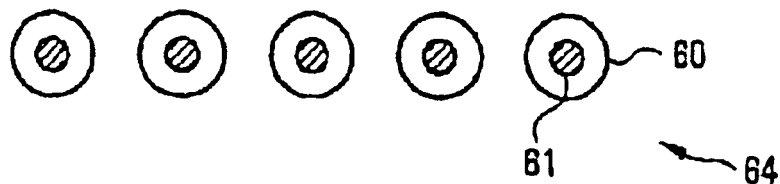
FIGS. 6a to 6c show an energy source, which is arranged in an envelope.
Figure 6:
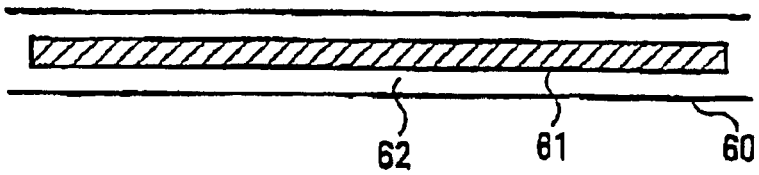
Figure 6:
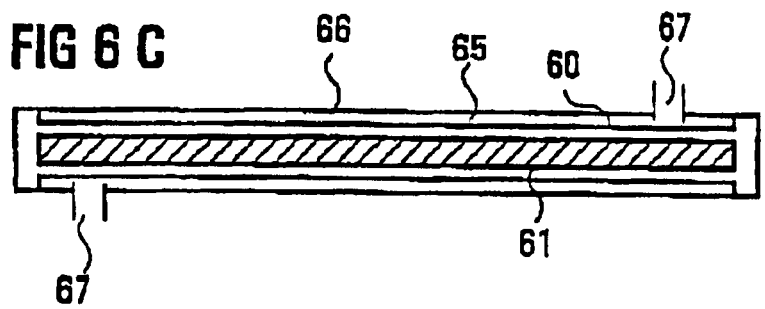

The energy sources 32 and 42 are, in one configuration, rod-shaped halogen lamps 61, which are arranged in the form of an array 64 (FIG. 6). Each of the halogen lamps 61 of the array 64 is arranged in a quartz glass envelope 60.

Figure 7:
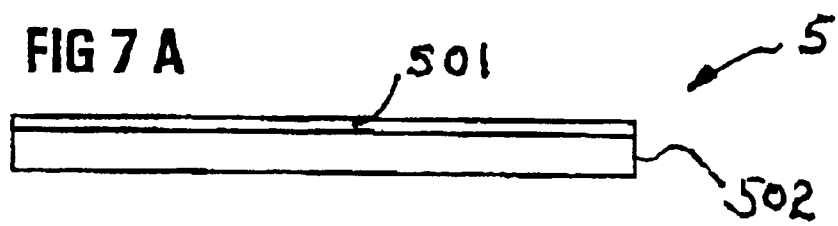
FIGS. 7a to 7c show various embodiments of the reflection body.
Figure 7:
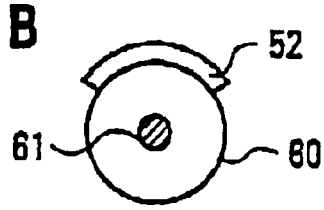
Figure 7:
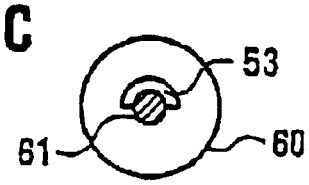

The intermediate space between envelope 60 and halogen lamp 61 has, flowing through it, a liquid or gaseous coolant 62. During the tempering process, the halogen lamps 61 emit an electromagnetic radiation 34 or 44 in the form of infrared radiation, which is absorbed by the process items 33 and 43 in order to accept a corresponding quantity of energy. For this purpose, the process items 33 and 43 are arranged in the radiation fields of the energy sources 32 and 42. In a first embodiment, the process item 33 of a tempering unit 3 is only exposed to the radiation field 34 of the energy source 32 of the tempering unit 3 (FIG. 2a). In a further embodiment, the process item 33 is additionally arranged in the radiation field 44 of the energy source 42 of an adjacent tempering unit 4 (FIG. 1). In a next embodiment, a reflection body 5 is arranged so as to form the radiation field (FIG. 2b). The reflection body 5 consists of an aluminum oxide coating 501 on a glass ceramic substrate 502 (FIG. 7a). The reflection body 5 reflects electromagnetic radiation 341, which meets the aluminum oxide coating 501, in the direction of the corresponding process item 33.

Two further solutions for the configuration of the reflection body 5 are shown in FIGS. 7b and 7c. The reflection body 52 is, as shown in FIG. 7b, a part of the envelope 60 of the energy source 61. From FIG. 7c, the reflection body 53 is arranged directly on a quartz glass envelope of the halogen lamp 61.

In a further configuration, the reflection body 5 is partially permeable to the electromagnetic radiation 34 so that a part of the radiation 342 is given up in an adjacent half space (FIG. 2b).

In one embodiment, the envelopes 60 are open at both ends (FIG. 6b). For cooling purposes, a coolant 62 in the form of a cooling gas is pumped through the envelope 60. In a further embodiment, the envelope 60 is supplemented by a covering 66 (FIG. 6c). The intermediate space generated by this between the covering 66 and the envelope 60 is provided with supply and drain 67 and a cooling fluid 65 flows through it for cooling purposes.

As shown in FIG. 2c, the tempering unit has available an additional energy source 7 with an additional electromagnetic radiation 71, to which the process item 33 is exposed. From FIG. 2d, a transparent body 8 and 9 are respectively arranged in the radiation fields of the energy source 32 and the additional energy source 7. The transparent bodies 8 and 9 are glass ceramic plates, which are semitransparent to the electromagnetic radiation 34 and the additional electromagnetic radiation 71. The process item 33 lies on one transparent body 8. A part of the electromagnetic radiation 71 is absorbed by this transparent body 8 and is led on to the process item 33 in the form of thermal conduction 81.

Further embodiments may be seen in FIGS. 2e and 2f. From FIG. 2e, the tempering unit 3 exhibits an open tempering container 10 in which the process item 33 is arranged. A container wall 101 of the tempering container 10 exhibits a transparent body 8. The container wall 101 is the bottom of the tempering container 10. The tempering container 10 can be closed, according to the embodiment of FIG. 2f. The tempering container 10 has closable openings (gas openings) 11 available for evacuating and filling the tempering container 10 with process gas, which openings are configured as valves. As an alternative to this, the valves are self-closing (non-return valves).

FIG. 3 shows one possibility for jointly exposing the tempering container 10 of two tempering units 3 and 4 to the process gas 12. In this arrangement, the tempering containers 10 are connected together by means of the gas inlets and outlets 35, 36, 45 and 46. In another embodiment, each tempering container is separately filled with process gas 12.

Figure 5:
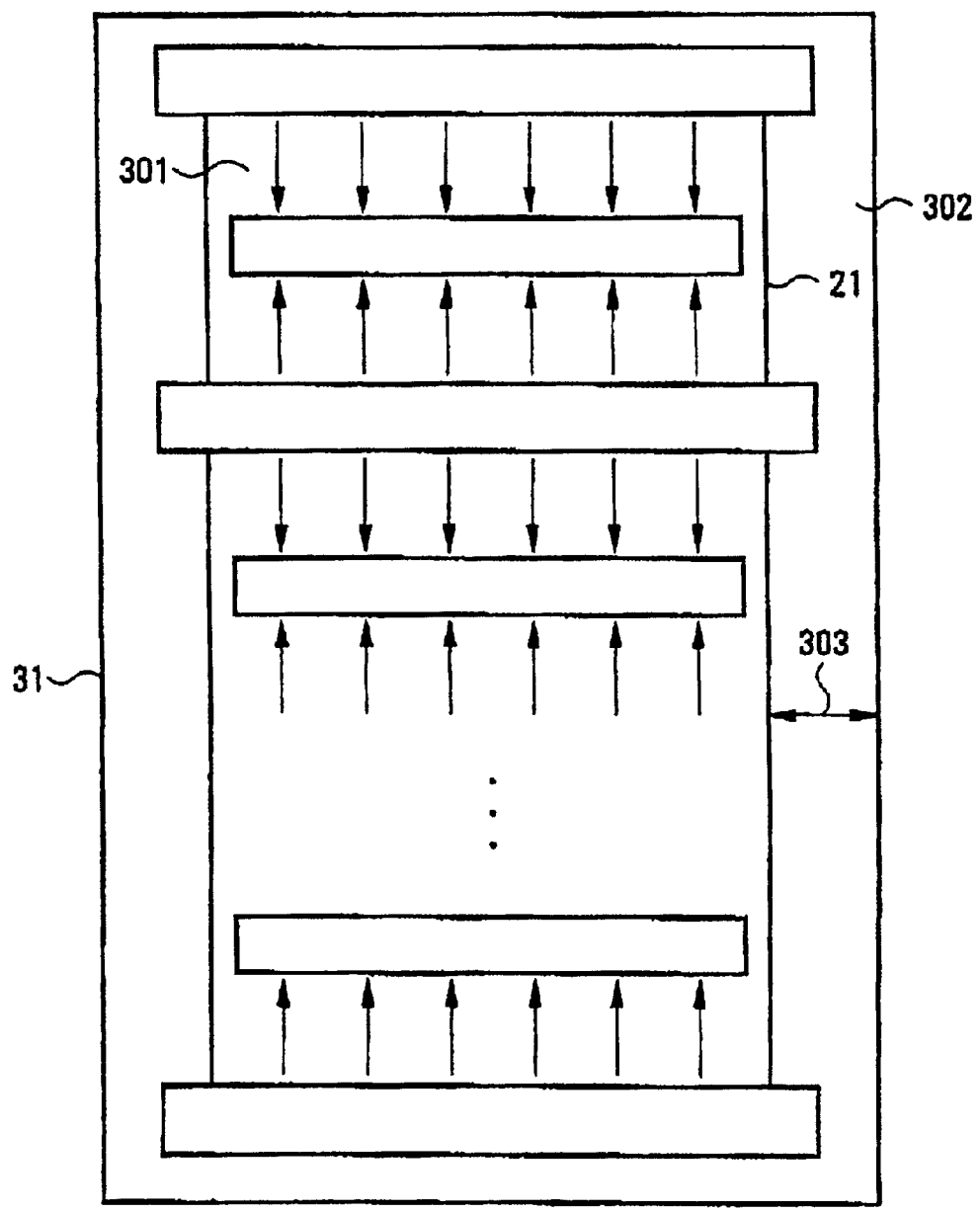
FIG. 5 shows a stack body, which is arranged in a tempering chamber which can be evacuated.

FIG. 4 shows a tempering stack 2, whose stack walls are partially formed by the body walls of the stack body 21. Additional walls are provided by reflection bodies 5 in the form of reflection plates (FIG. 7a). In a further embodiment, this tempering stack 2 is arranged at a distance 303 in a tempering chamber 31 which can be evacuated (FIG. 5).

Figure 8:
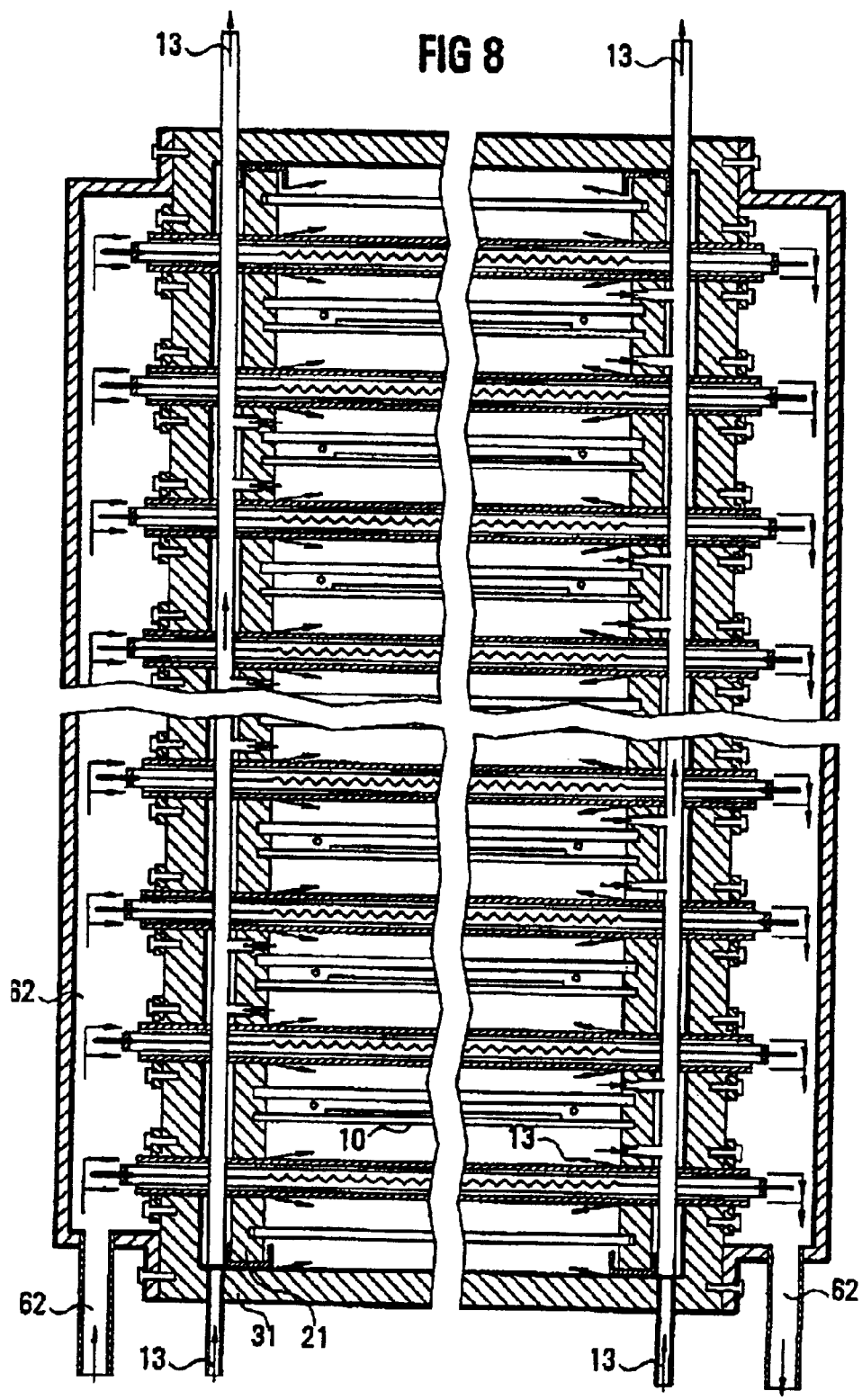
FIG. 8 shows a cross section through a certain appliance for tempering.
Figure 9:
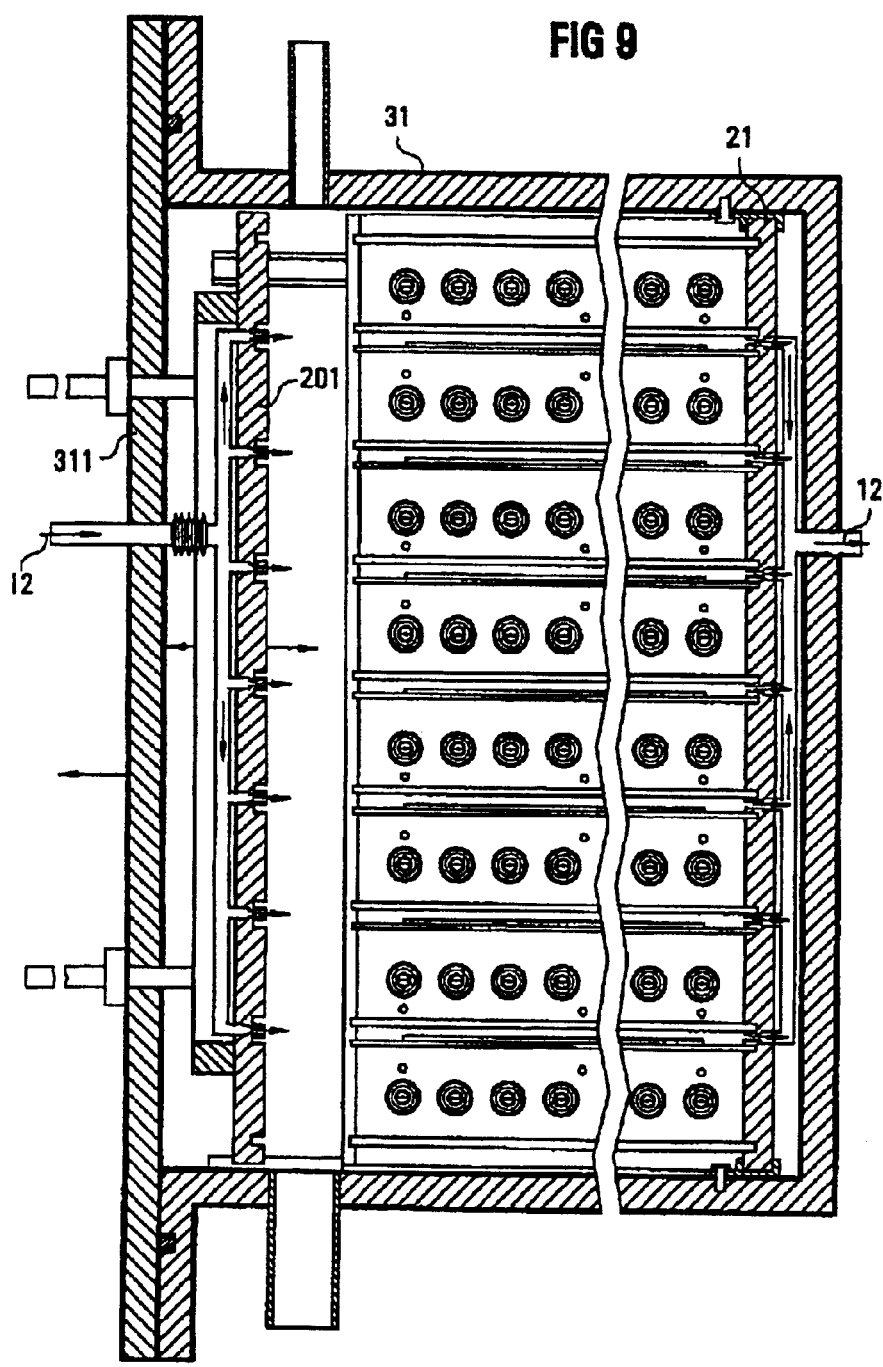
FIG. 9 shows a longitudinal section through the certain appliance for tempering.
Figure 10:
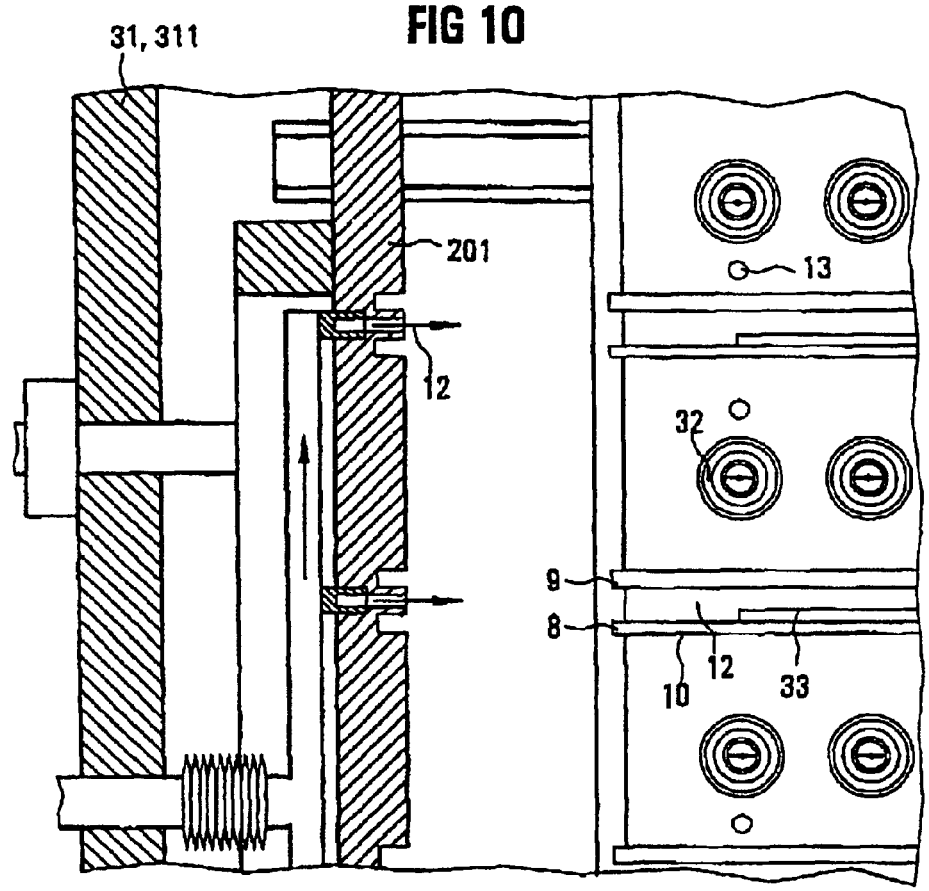
FIG. 10 shows an excerpt from the longitudinal section of the certain appliance for tempering.
Figure 11:
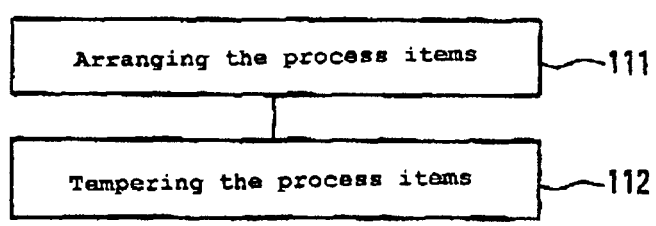
FIG. 11 shows a method for tempering a plurality of process items.

A particular embodiment is shown in the FIGS. 8 to 10. Each of the tempering units 3 and 4 of the tempering stack 2 is built up in such a way as is represented in FIG. 2d, none of the tempering units 3 and 4 having an additional energy source 7. The energy sources 32 and 42 are arrays 64 of rod-shaped halogen lamps 61. The upper and lower termination of the tempering stack 2 respectively forms a plate-shaped reflection body 5 with array 64 of halogen lamps 61, arranged toward the tempering stack 2, as energy source. The transparent bodies 8, 9 in the form of glass ceramic plates are pushed into grooves in the stack body 21.

One tempering container 10 is formed from two transparent bodies 8 and 9 and the body wall of the stack body 21. The tempering container 10 has available openings 11 for producing a certain gas atmosphere in the tempering containers 3 and 4.

Figure 12:
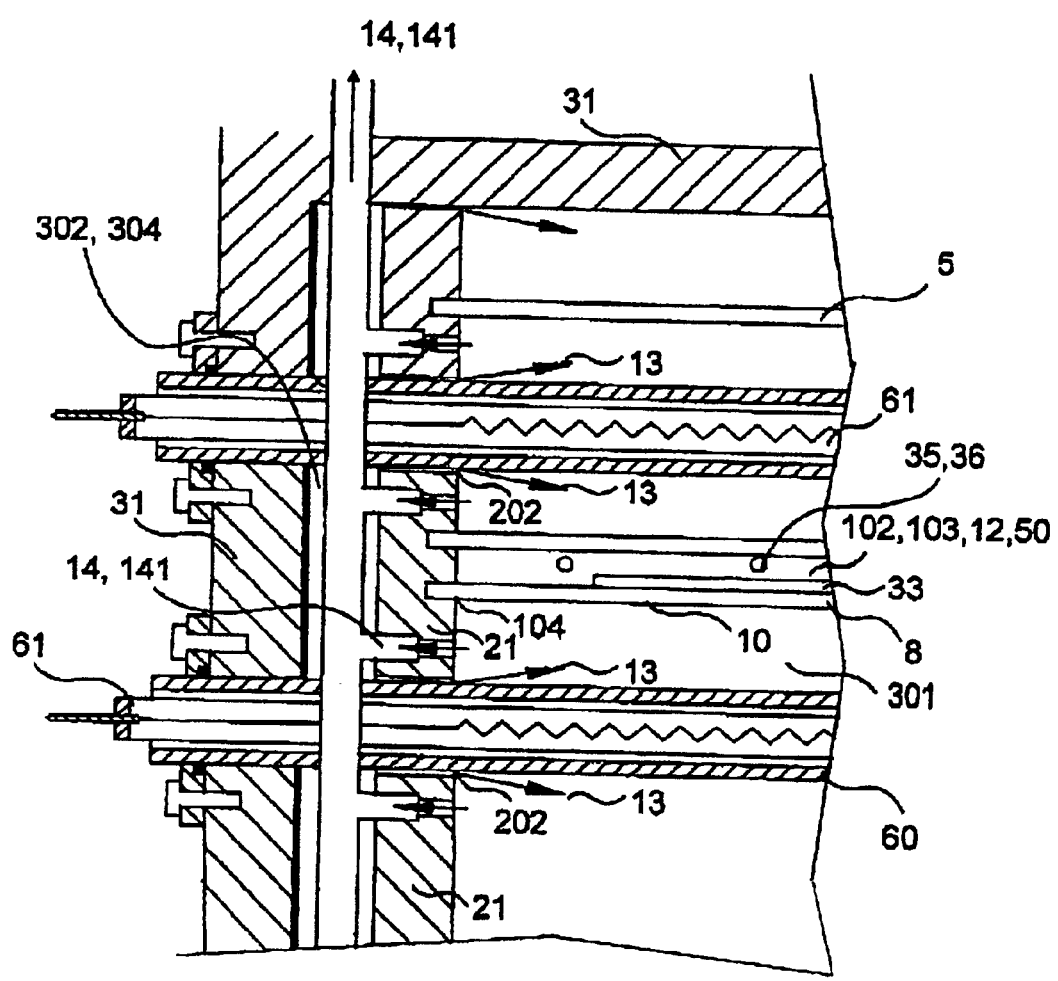
FIG. 12 shows a cross section through an embodiment for processing a plurality of process items while emphasizing the principle of the gas counterflow scavenging.

FIG. 12 shows an excerpt from FIG. 8 in order to emphasize the gap counterflow scavenging. A pressure gradient or a gas flow 13 resulting from this is indicated by the arrows. During the tempering process, a gas atmosphere 50 of the process gas 12 at a certain gas pressure 103 is present in a container inlet space 102 of a tempering container 10. The process gas 12 can emerge into the hollow space 301 of the stack body 21 through a gap 104 of the tempering container 10. In order to prevent the chamber wall within the tempering chamber 31 being contaminated by the process gas 12, the hollow space 301 is connected to surroundings 14 in which is present a gas pressure 141 which is smaller than the gas pressure 103 in the container internal space 102 of the tempering chamber 31. At the same time, this ensures that a gas pressure 304, which corresponds approximately to the gas pressure 103 which is present in the container internal space 102 of the tempering container 10, is present in the intermediate space 302 between the chamber wall of the tempering chamber 31 and the body wall of the stack body 21. It is somewhat larger so that the process gas 12 does not pass through a gap 202 of the stack body 21 into the intermediate space 302. Because the gas pressure 141, which is smaller in comparison to the pressures 103 and 304, is present in the surroundings 14, process gas 12 possibly present in the hollow space 301 of the stack body 21 is transported in the direction of the surroundings 14 because of the pressure gradients present. In the case of toxic process gases or vapors, these are removed by intermediately connected removal units such, for example, as wet washing units or cooling traps. Only carrier gases which are unproblematic are then, for example, released into the surroundings 14.

The stack body 21 is inserted in a tempering chamber 31. The stack body 21 has available a door 201 which can be opened independently of the door 311 of the tempering chamber 31. The door simultaneously represents a container wall of the tempering container.

The following procedure of a method for the tempering process is given as an example:

Loading the stack body with the process items (111)

Closing the tempering chamber.

Multiple pumping out and filling of the tempering chamber with inert gas with the stack body open.

Closing the stack body and, by this means, closing the tempering chamber.

Opening the scavenging gas inlet and outlet for gap counterflow scavenging.

Opening the process gas inlet and outlet into the tempering container and carrying out the desired process gas partial pressure profile.

Adjusting a low cooling air flow through the envelopes of the energy sources.

Tempering (112): switching on the energy sources and regulating the heating array in accordance with a desired temperature profile. Regulation input parameter is the signal from thermal elements, which are applied, in one embodiment, to the tempering containers 10.

Switching on or regulating down the energy sources 32, 42 and 7 and control of the cooling profile by regulating the cooling air flow.

Introducing a scavenging gas into the process gas inlets.

Opening the stack body and multiple pumping down and filling with inert gas.

Opening the tempering chamber and unloading the process item.

In one embodiment, an upper heating and lower heating of a process item is separately triggered during the tempering process. This, however, is only possible with energy sources which can be separately triggered and between which the process item is located. The following alternative solutions exist for the case where one energy source is provided in the tempering stack for one process item and where, during the tempering process, a fixed adjustment of the ratio between upper heat and lower heat can be tolerated:

Bottom and cover of the tempering container 10 consist of different infrared-permeable material. The cover is in glass ceramic which partially absorbs infrared. The bottom exhibits a graphite. In another embodiment, the cover is in quartz glass and the bottom in ceramic.

Bottom and cover of the tempering container consist of the same material but have a different optical density with respect to the infrared radiation and different thicknesses of bottom and cover.

The energy sources are coated on one side with infrared partial reflectors.

The envelopes are coated on one side with infrared partial reflectors.

Use of reflection bodies between the tempering units.

What is claimed is:

1. An appliance for tempering a plurality of process items in a certain gas atmosphere by acceptance of a quantity of energy by a process item by means of absorption of a certain electromagnetic radiation and by acceptance of at least a further quantity of energy by at least one further process item by means of absorption of at least a further certain electromagnetic radiation, wherein the appliance comprises:

a first tempering unit and at least one further tempering unit arranged parallel to each other to form a stack extending in a stack direction between a first termination of the stack and a second termination of the stack, wherein each said tempering unit includes an energy source for generating the electromagnetic radiation and, during tempering, a process item arranged between the energy source of the first tempering unit and the energy source of the further tempering unit in the stack direction, and wherein the second termination of the stack is formed by an energy source, and, during tempering, a further process item arranged between the energy source of the tempering unit adjacent to the second termination and the energy source of the second termination.

2. The appliance as claimed in claim 1, wherein at least one of the tempering units comprises at least one additional energy source for generating an additional quantity of energy and for getting the additional quantity of energy accepted by the process item of the tempering unit.

3. The appliance as claimed in claim 1, wherein at least one of the tempering units comprises at least one reflection body for forming a radiation field of at least one of the electromagnetic radiations.

4. The appliance as claimed in claim 1, wherein the first termination of the stack is formed by a reflection body.

5. The appliance as claimed in claim 1, wherein the second termination of the stack further comprises a reflection body.

6. The appliance as claimed in claim 1, wherein the first termination of the stack is formed by a reflection body, and wherein the second termination of the stack further comprises a reflection body.

7. The appliance as claimed in claim 3, wherein the reflection body comprises a material which at least partially reflects the electromagnetic radiation of the energy source.

8. The appliance as claimed in claim 1, wherein at least one of the tempering units further includes means for cooling the process item.

9. The appliance as claimed in claim 1, wherein at least one of the energy sources is arranged in an envelope, which is at least partially transparent to the electromagnetic radiation of the respective energy source.

10. The appliance as claimed in claim 9, further comprising means for passing a cooling fluid through the envelope of the energy source.

11. The appliance as claimed in claim 9, wherein the envelope of the energy source includes a reflection body.

12. The appliance as claimed in claim 1, wherein at least one said tempering unit includes a tempering container, for holding the process item of the tempering unit, which tempering container comprises a container wall.

13. The appliance as claimed in claim 1, wherein the tempering stack forms a stack body with a body wall.

14. The appliance as claimed in claim 1, further comprising a tempering chamber having a chamber wall, in which chamber during normal operation the stack is arranged.

15. The appliance as claimed in claim 13, further comprising a tempering chamber having a chamber wall, in which chamber during normal operation the stack body is arranged.

16. The appliance as claimed in claim 15, wherein at least one of the stack body and the tempering chamber is tempered.

17. The appliance as claimed in claim 15, wherein the tempering chamber is provided with a vacuum-tight door, on which, inside the tempering chamber, a door of the stack body is arranged, wherein a door of the stack body can be opened and closed independently of a door of the tempering chamber.

18. The appliance as claimed in claim 12, wherein the container wall comprises means for producing the gas atmosphere.

19. The appliance as claimed in claim 13, wherein the body wall comprises means for producing the gas atmosphere.

20. The appliance as claimed in claim 14, wherein the chamber wall comprises means for producing the gas atmosphere.

21. The appliance as claimed in claim 18, wherein the means is a gas opening for at least one gas for evacuating and/or filling the tempering container with the gas.

22. The appliance as claimed in claim 1, wherein at least one of the process items is a multilayer body with at least one layer which exhibits a certain absorption for the electromagnetic radiation.

23. The appliance as claimed in claim 1, wherein at least one of the tempering units further includes a transparent body that exhibits a certain absorption and a certain transmission for the electromagnetic radiation and which is arranged in the radiation field of the electromagnetic radiation between the energy source of the electromagnetic radiation and one of the process items.

24. The appliance as claimed in claim 23, wherein the transparent body comprises a material which is inert with respect to the gas.

25. A method of tempering a process item and at least one further process item while using an appliance as claimed in claim 1, comprising steps of:
   a) arranging the tempering unit with the process item and the further tempering unit with the further process item to form the tempering stack; and
   b) tempering the process item and the further process item.

26. The method as claimed in claim 25, in which the process item and/or the further process item are brought into contact with at least one process gas.

27. The method as claimed in claim 25, further comprising the steps of:
   c) arranging the tempering stack in a hollow space of a stack body;
   d) arranging the stack body in a tempering chamber at a distance from the tempering chamber, so that an intermediate space occurs between the stack body and the tempering chamber; and
   e) producing a gas pressure of a scavenging gas in the intermediate space.

28. The method as claimed in claim 27, wherein a gas pressure of a scavenging gas is generated in the intermediate space between tempering chamber and the stack body, which gas pressure is larger than the gas pressure in the hollow space of the stack body.

29. The method as claimed in claim 28, wherein a connection is produced by an opening, between the intermediate space and the hollow space, in such a way that a pressure gradient can be set between. the hollow space and the intermediate space.

30. The method as claimed in claim 25, in which a multilayer body with a layer and at least one further layer is used as process item and/or further process item.

31. The method as claimed in claim 25 for producing a photovoltaic thin-layer chalcopyrite absorber of a solar cell and/or a solar module.

* * * * *